(12) United States Patent
Petrenko et al.

(10) Patent No.: US 8,183,744 B2
(45) Date of Patent: May 22, 2012

(54) PIEZOELECTRIC MOTOR

(75) Inventors: Serhiy Petrenko, Kiev (UA); Valentin Rangelov Zhelyaskov, Sarasota, FL (US)

(73) Assignee: Discovery Technology International, Inc., Sarasota, FL (US)

( * ) Notice: Subject to any disclaimer, the term of this patent is extended or adjusted under 35 U.S.C. 154(b) by 46 days.

(21) Appl. No.: 12/639,172

(22) Filed: Dec. 16, 2009

(65) Prior Publication Data

US 2010/0156240 A1 Jun. 24, 2010

Related U.S. Application Data

(60) Provisional application No. 61/139,439, filed on Dec. 19, 2008.

(51) Int. Cl.
*H01L 41/047* (2006.01)
*H02N 2/04* (2006.01)

(52) U.S. Cl. ............... 310/323.16; 310/323.01; 310/366

(58) Field of Classification Search ............ 310/323.01–323.21, 328, 365, 366
See application file for complete search history.

(56) References Cited

U.S. PATENT DOCUMENTS

| | | | |
|---|---|---|---|
| 3,603,706 A | 9/1971 | Cermak et al. |
| 3,963,380 A | 6/1976 | Thomas, Jr. et al. |
| 4,344,743 A | 8/1982 | Bessman et al. |
| 4,352,636 A | 10/1982 | Patterson et al. |
| 4,453,103 A | 6/1984 | Vishnevsky et al. |
| 4,478,217 A | 10/1984 | Shimada et al. |
| 4,648,807 A | 3/1987 | Tippetts et al. |
| 4,909,212 A | 3/1990 | Minowa et al. |
| 4,959,580 A | 9/1990 | Vishnevsky et al. |
| 5,036,944 A | 8/1991 | Danley et al. |
| 5,172,023 A | 12/1992 | Kawai et al. |
| 5,258,239 A | 11/1993 | Kobayashi |
| 5,362,213 A | 11/1994 | Komatsu et al. |

(Continued)

FOREIGN PATENT DOCUMENTS

JP 63089074 A 4/1988

(Continued)

OTHER PUBLICATIONS

International Search Report mailed Feb. 24, 2010; Application Serial No. PCT/US2009/068217 in the name of Discovery Technology International, LLP.

(Continued)

*Primary Examiner* — Derek Rosenau

(74) *Attorney, Agent, or Firm* — Fox Rothschild, LLP; Robert J. Sacco

(57) ABSTRACT

A piezoelectric motor includes a piezoresonator body (3) having opposing front and back surfaces and opposing first and second end surfaces. The front (17) and the back (18) surfaces are substantially parallel to first (15) and second (16) longitudinal axes of the piezoresonator body. The end surfaces (2) are substantially perpendicular to the first longitudinal axis and substantially parallel to the second longitudinal axis and are separated by a length (L) of the piezoresonator body. The motor also includes at least one common electrode (6) disposed on the back surface and at least 6n excitation electrodes (7-12) disposed across the front surface in two symmetric rows extending along L, where n is an integer $\geq 1$. In the motor, the piezoelectric body has an $n^{th}$ order longitudinal vibration frequency ($v_1$) along L and a $3n^{th}$ order bending vibration frequency ($v_2$) along L, and where $v_1$ and $v_2$ are substantially equal.

18 Claims, 7 Drawing Sheets

U.S. PATENT DOCUMENTS

| | | | |
|---|---|---|---|
| 5,604,392 | A | 2/1997 | Vig |
| 5,726,518 | A | 3/1998 | Takagi |
| 5,839,467 | A | 11/1998 | Saaski et al. |
| 5,877,579 | A * | 3/1999 | Zumeris .................. 310/323.01 |
| 6,116,257 | A | 9/2000 | Yokota et al. |
| 6,230,738 | B1 | 5/2001 | Watanabe et al. |
| 6,260,579 | B1 | 7/2001 | Yokota et al. |
| 6,467,350 | B1 | 10/2002 | Kaduchak et al. |
| 6,469,420 | B2 | 10/2002 | Iarochenko et al. |
| 6,575,669 | B2 | 6/2003 | Takasan |
| 6,715,731 | B1 | 4/2004 | Post et al. |
| 6,964,327 | B2 | 11/2005 | Chang et al. |
| 7,095,160 | B2 | 8/2006 | Uchino et al. |
| 7,219,848 | B2 | 5/2007 | Sweeton |
| 7,395,607 | B1 | 7/2008 | Broderick et al. |
| 7,876,022 | B2 | 1/2011 | Petrenko et al. |
| 2001/0013740 | A1 | 8/2001 | Fukui et al. |
| 2001/0022485 | A1 | 9/2001 | Oda et al. |
| 2002/0017831 | A1 | 2/2002 | Iarochenko et al. |
| 2002/0033651 | A1 | 3/2002 | Iarochenko et al. |
| 2004/0013740 | A1 | 1/2004 | Weickmann |
| 2004/0027032 | A1* | 2/2004 | Moteki et al. ............ 310/323.02 |
| 2004/0189150 | A1* | 9/2004 | Yamamoto et al. ...... 310/323.02 |
| 2004/0256956 | A1 | 12/2004 | Miyazawa |
| 2005/0012433 | A1 | 1/2005 | Brady et al. |
| 2005/0151107 | A1 | 7/2005 | Shu |
| 2005/0268921 | A1 | 12/2005 | Zumeris et al. |
| 2006/0006764 | A1* | 1/2006 | Ganor et al. ................. 310/328 |
| 2006/0244341 | A1 | 11/2006 | Uchino et al. |
| 2007/0119505 | A1 | 5/2007 | Petrenko |
| 2009/0121586 | A1 | 5/2009 | Kesil |
| 2010/0148102 | A1 | 6/2010 | Petrenko et al. |
| 2010/0148630 | A1 | 6/2010 | Petrenko et al. |
| 2010/0150754 | A1 | 6/2010 | Petrenko et al. |
| 2010/0289362 | A1 | 11/2010 | Petrenko et al. |
| 2011/0050038 | A1 | 3/2011 | Zhelyaskov et al. |

FOREIGN PATENT DOCUMENTS

| | | |
|---|---|---|
| JP | 06-205590 A | 7/1994 |
| JP | 10-117486 A | 5/1998 |
| JP | 2004-312810 A | 11/2004 |
| JP | 2006-299889 A | 11/2006 |
| KR | 2005-0007944 A | 1/2005 |
| KR | 10-0728510 B1 | 6/2007 |
| KR | 2009-0054728 A | 6/2009 |
| SU | 1782316 A3 | 12/1992 |
| SU | 1825435 A3 | 6/1993 |
| UA | 4169 | 2/1993 |
| WO | WO-2007-064310 A1 | 6/2007 |
| WO | WO-2008057061 A2 | 5/2008 |

OTHER PUBLICATIONS

Leletty, R., et al., "Valves Based on Amplified Piezoelectric Actuators" [online], [retrieved on Jun. 20, 2011]. Retrieved from the Internet: http://www.cedrat.com/fileadmin/user_upload/cedrat_groupe/Publications/Publications/2002/06/Actuator2002_A4-6_VALVES-BASED-ON-AMPLIFIED-PIEZOELECTRIC-ACTUATORS.pdf.

Lindler, J.E., et al. "Piezoelectric Direct Drive Servovalve" CSA Engineering, Mountain View, CA., "Industrial and Commercial Applications of Smart Structures Technologies", San Diego, CA Mar. 2000.

Kasatkin, A. S. "Asynchronous Brushless Machines", Fundamentals of Electronics. Moscow Energy. 1966. Ch. 17, pp. 484-487.

Kasatkin, A.S. "Commutator Machines", Fundamentals of Electronics. Moscow Energy. 1966, Ch. 18, pp. 540-543.

Maleev, P. I. "Gyroscopes with Electrical Suspension of Rotor", New Types of Gyroscopes, Leningrad, Sudostroenie, 1971, p. 9 and p. 31.

Information about Related Patents and Patent Applications, see section 6 of the accompanying Information Disclosure Statement Letter, which concerns Related Patents and Patent Applications.

International Search Report mailed May 18, 2011 in International Application Serial No. PCT/US2010/047494 in the name of Discovery Technology International, LLLP, et al.

International Search Report Mailed Dec. 27, 2010 in International Application No. PCT/US2010/35156 in the name of Discovery Technology International, LLLC.

Ermakov, V.S., et al., "Problems and ways of Improvements of Modulation Gyro with Spherical Gas-Lubricated Spin-Axis Bearing System," proceedings of teh VII St. Petersburg International Conference on Integrated Navigation Systems, St. Petersburg, Russia, May 29-31, 2000, pp. 196-199.

* cited by examiner

100

100

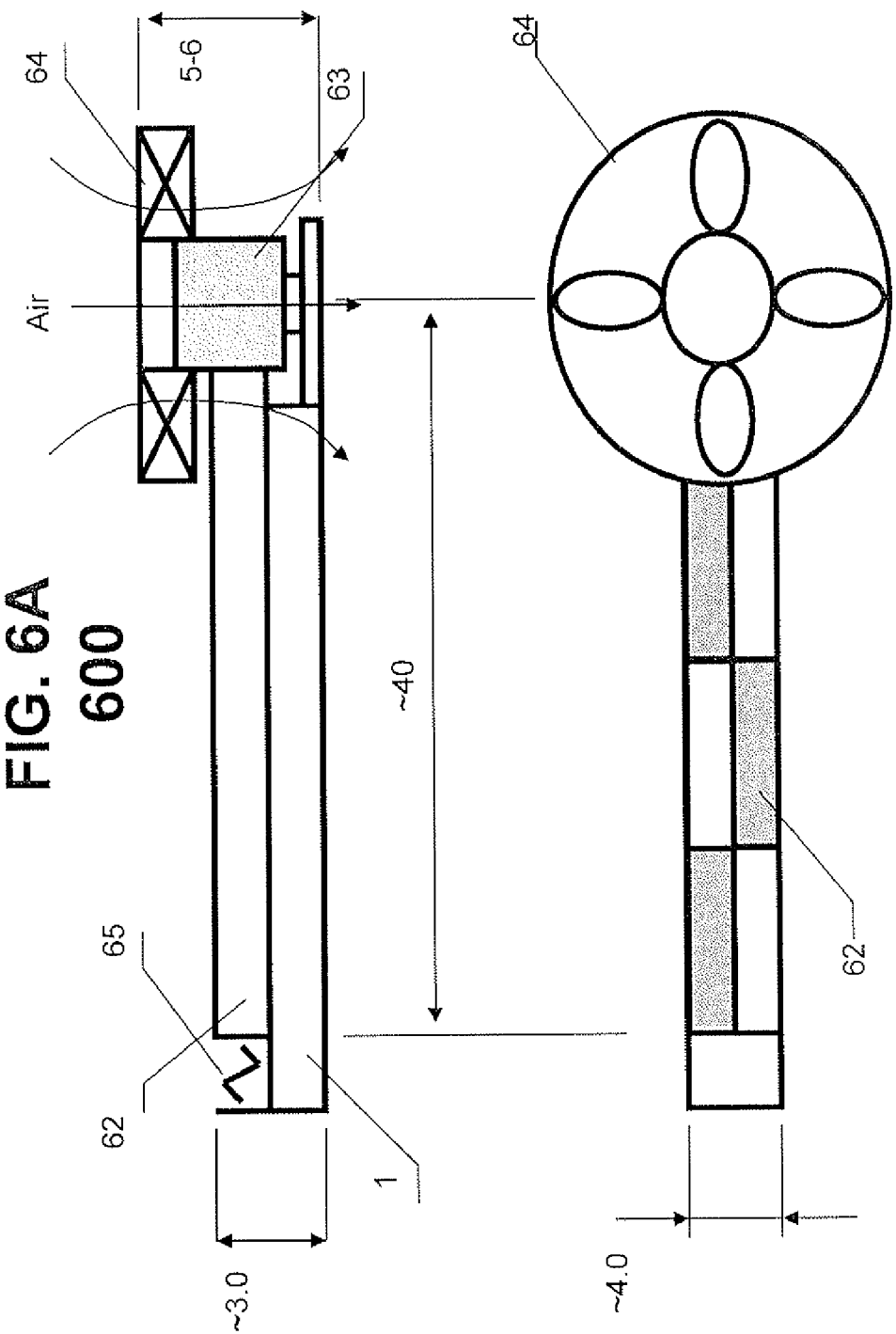

650

PIEZOELECTRIC MOTOR

This application is a non-provisional patent application claiming the benefit of U.S. Patent Application No. 61/139,439 filed on Dec. 19, 2008. The entirety which is incorporated herein by reference.

BACKGROUND OF THE INVENTION

1. Field of the Invention

The invention relates to the field of electric motors, and specifically to the field of piezoelectric motors.

2. Background

In general, miniature electric motors are utilized in the fields of microsurgery, microbiology, and microelectronics, to name a few. Unfortunately, the miniaturization of electric motors for use in these and other fields is typically associated with a sharp decrease in motor efficiency. For example, as miniature electric motors are reduced to operate using diameters of less than 10 mm, it is not unusual to see efficiency degradation to as low as 2% or less. Even though this effect does not generally apply to the miniaturization of the piezoelectric motors, miniaturization itself can still lead to design complications. For example, miniaturized piezoelectric motors are generally prone to having poor reliability and experiencing degradation of motor parameters such as resolution, torque, and speed, to name a few.

In general, the conventional piezoelectric motor designs incorporate a piezoelectric resonator with electrodes to stimulate the simultaneous excitation of longitudinal and bending vibrations. The piezoresonator interacts with a moving rotor by friction over a contact area between the resonator and rotor. In such motors, a flat piezoelectric resonator is generally used, in which both longitudinal and flexural deformations are excited.

In some conventional piezoelectric motor design, a drive mechanism can be provided which uses a rectangular piezoresonator with electrodes positioned to excite both longitudinal and lateral vibrations. Consequently, the piezoresonator can interact by contacting a moving part (rotor) through at least one contact pad. In general, the size of the resonator and the shape of the resonator electrodes are constructed to enable the simultaneous formation of the first longitudinal mode and the second bending mode of vibration along the length of the resonator. If the frequencies of these two modes are equal, the contact pad typically vibrates. In particular, the contact pad follows an elliptical path a plane parallel to the plane containing all electrodes. Via friction, the contact pad causes rotation of the rotor. Such piezoresonators are typically polarized normal to the plane containing the electrodes with a common electrode occupying one flat surface of the piezoresonator. The opposite flat surface is generally divided into four symmetrically disposed sectors each one of which has an active electrode.

SUMMARY

The embodiments of the invention concern piezoelectric motors. In a first embodiment of the invention, a piezoelectric motor is provided. The motor includes a piezoresonator body having opposing front and back surfaces and opposing first and second end surfaces. The front and the back surfaces are substantially parallel to first and second longitudinal axes of the piezoresonator body and the first and the second end surfaces are substantially perpendicular to the first longitudinal axis and substantially parallel to the second longitudinal axis and separated by a length (L) of the piezoresonator body. The motor also includes at least one common electrode disposed on the back surface and at least 6n excitation electrodes disposed across the front surface along L in two symmetric rows extending along L, where n is an integer $\geq 1$. In the motor, the piezoelectric body has an $n^{th}$ order longitudinal vibration frequency ($v_1$) along L and a $3n^{th}$ order bending vibration frequency ($v_2$) along L, and where $v_1$ and $v_2$ are substantially equal.

In a second embodiment of the invention, a pump is provided. The pump includes a piezoelectric motor. The piezoelectric motor includes a piezoresonator body having opposing front and back surfaces and opposing first and second end surfaces. The front and the back surfaces are substantially parallel to first and second longitudinal axes of the piezoresonator body. The first and second end surfaces are substantially perpendicular to the first longitudinal axis and substantially parallel to the second longitudinal axis and separated by a length (L) of the piezoresonator body. The motor also includes at least one common electrode disposed on the back surface and at least 6n excitation electrodes disposed across the front surface along L in two symmetric rows extending along L, where n is an integer $\geq 1$. In the motor, the piezoelectric body has an $n^{th}$ order longitudinal vibration frequency ($v_1$) along L and a $3n^{th}$ order bending vibration frequency ($v_2$) along L, where $v_1$ and $v_2$ are substantially equal.

DETAILED DESCRIPTION

Figure 1:
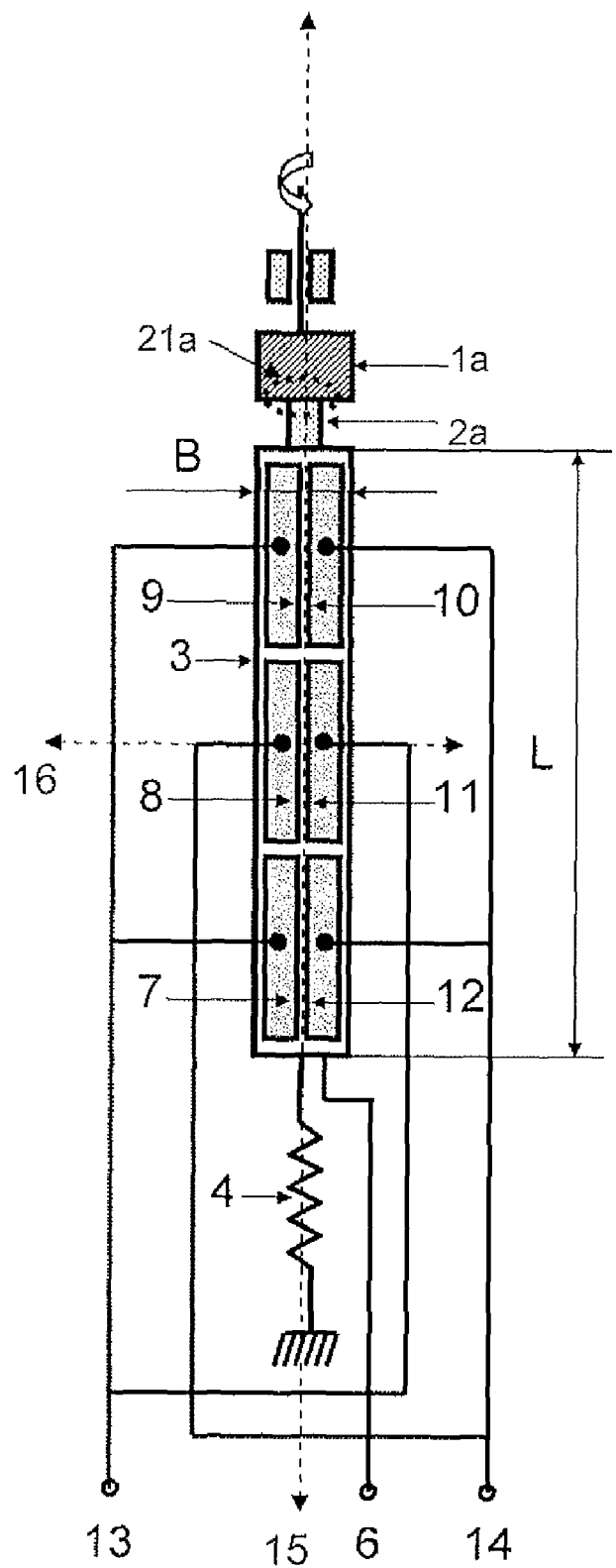
FIG. 1 is a schematic side view of an exemplary piezoelectric motor configured in accordance with an embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the present invention provide improved piezoelectric motors which can be used for the development of miniature piezoelectric rotary motors with a diameter of less than 10 mm. Such motors can be used for various applications, including, microsurgery, microbiology, and microelectronics, to name a few. As previously described, conventional piezoelectric motors are susceptible to problems as a result of miniaturization. In general, the minimization of such piezoelectric drive mechanisms is hindered by significant fundamental difficulties.

In particular, miniaturization of the width of conventional piezoelectric motors, which determines the minimum diameter of the motor, can be problematic. For example, a miniaturization by less than an order of magnitude of the width of the resonator leads to a lower frequency of the bending mode of vibration. This lower frequency generally contributes to an increased disparity between the frequencies of the first longitudinal and the second bending modes, therefore limiting efficiency. Typically, to compensate for this frequency shift, an increase in the length of the resonator is required, which results in an increase in the motor length. Furthermore, side pressure-applying clips are typically required for holding or clamping the piezoresonator at waveform stationary points. These clips generally add significantly to the overall width, further limiting the minimum achievable width for the motor.

Piezoelectric motors configured in accordance with the various embodiments of the present invention overcome the limitations of conventional miniaturized piezoelectric motors by allowing a minimization of the dimensions of the piezoelectric motor (in particular its outside diameter) with little or no increase in its length. This is primarily achieved by utilizing a piezoelectric resonator (piezoresonator) in which the first longitudinal mode and the third bending mode (instead of the second bending mode as in the prototype) are formed simultaneously along the length of the piezoresonator.

Accordingly, the various embodiments of the present invention provide piezoelectric motors including a piezoresonator with electrodes and electrode leads for the simultaneous excitation of longitudinal and bending vibrational modes. In operation, the piezoelectric motor with a rotor via friction forces between the rotor and at least one contact pad on a first end of the piezoresonator. The contact pad can be applied to the rotor under pressure applied by a mechanical spring-like pressure device contacting a second opposite end of the piezoresonator. In some embodiments, the piezoresonator is made in the form of a thin rectangular plate or cuboid with length L and width B that is polarized normal to the flat surface (defined by L and B) having the electrodes fixed thereon.

In general, the frequency $v_1$ of longitudinal vibrations along a length L of a piezoresonator for the first order mode has the form:

$$v_1 = C_1/\lambda_1 = C_1/2L, \quad (1)$$

where $\lambda_1$ is wavelength of the first longitudinal mode vibration which is formed along the length of the piezoresonator, L is the length of the piezoresonator, and $C_1$ is speed of propagation of longitudinal vibrations in the piezoelectric resonator. The frequency $v_2$ of the bending vibrations along the length L of the resonator for the $n^{th}$ order vibrational mode is given by the expression:

$$v_2 = \pi \times B(n+0.5)^2 \times C_2/(4L^2), \quad (2)$$

where B is the width of the piezoresonator and $C_2$ is the speed of propagation of bending vibrations in the piezoelectric resonator. For the third-order mode (n=3), equation (2) becomes:

$$v_2 = \pi \times B(3+0.5)^2 \times C_2/(4L^2) \quad (3)$$

Furthermore to provide the resonance necessary for the formation of a nano-ellipse at the contact pad, $v_1 = v_2$. Therefore, setting equation (1) and equation (2) equal to each other provides:

$$C_1/2L = \pi \times B(3+0.5)^2 \times C_2/(4L^2), \quad (4)$$

or after rearranging:

$$L/B = 0.45(3+0.5)^2; L/B = 5.5 \quad (5)$$

Therefore, if a piezoresonator is configured for using the third-order bending mode with resonator length of L=37 mm, the width (outside diameter) according to equation (5) would be approximately B=6.7 mm. In a conventional piezoelectric motor with the same length of L=37 mm, the width would be approximately 10 mm. Accordingly, by configuring the piezoresonator to utilize the third order bending mode, the width of the piezoresonator (and hence the outer diameter of the piezoelectric motor) can be decreased to a width of approximately ⅔ of the width of conventional piezoelectric motors without increasing the length of the piezoresonator. Consequently, the size of the motor is significantly reduced. Additionally, a piezoelectric motor configured in accordance with an embodiment of the present invention has no need for the side pressure-applying clips that are required for conventional piezoelectric motors, further reducing the motor diameter. As a result, in some instances, a 50% reduction the size of piezoelectric motor can be provided by utilizing a piezoelectric motor configured in accordance with an embodiment of the present invention.

Figure 2:
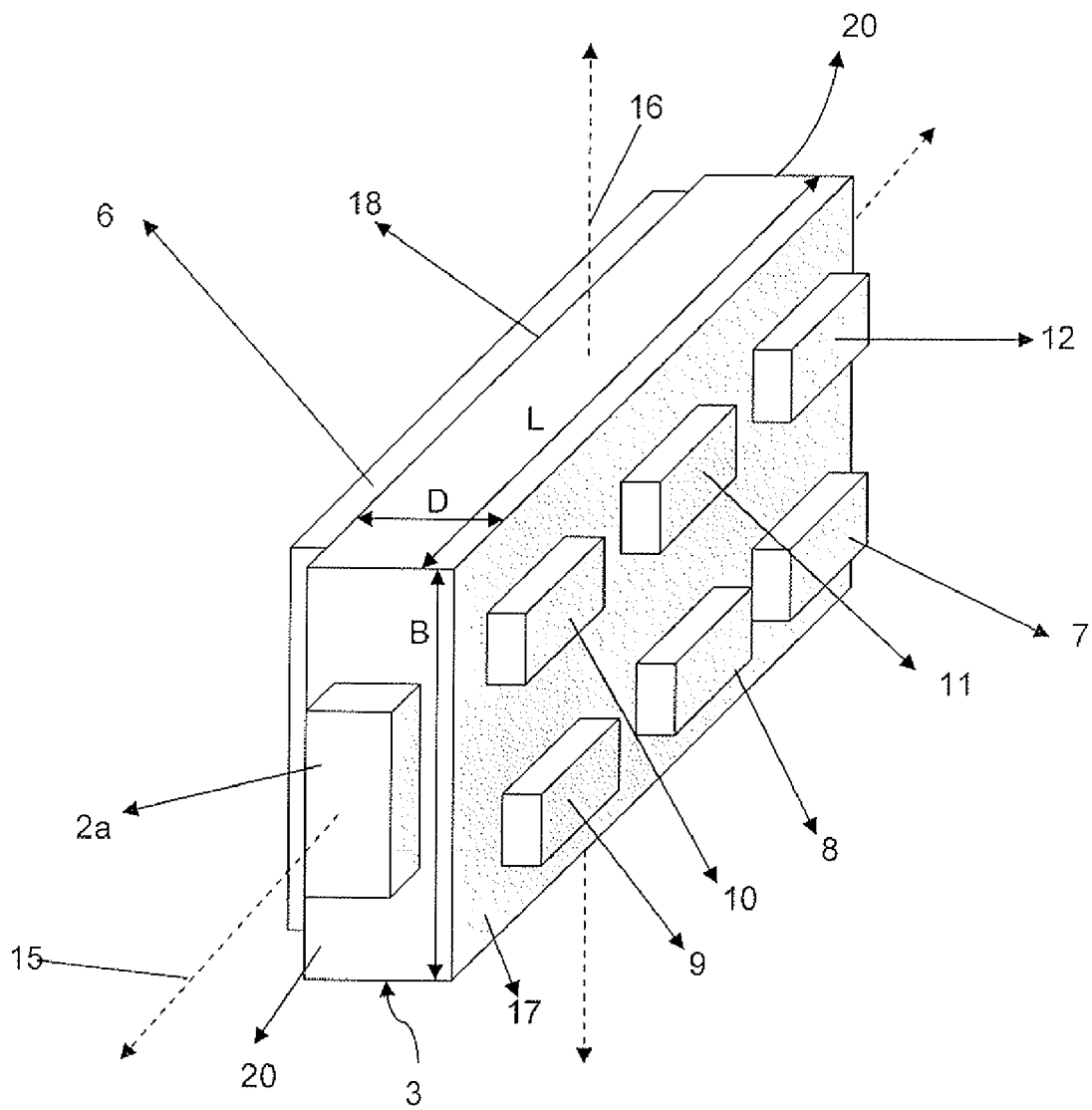
FIG. 2 is a perspective view of portions of the exemplary piezoelectric motor in FIG. 1.

An exemplary piezoelectric motor configured in accordance with an embodiment of the present invention will be described with respect to FIGS. 1 and 2. FIG. 1 is a schematic side view of an exemplary piezoelectric motor 100 configured in accordance with an embodiment of the present invention. FIG. 2 is a perspective view of portions of the exemplary piezoelectric motor 100 in FIG. 1. As shown in FIGS. 1 and 2, the piezoelectric motor 100 includes a piezoresonator 3, a contact pad 2a coupled to a first end 20 of the piezoresonator and a clip device 4, such as a spring, contacting a second end 20 of the piezoresonator 3. The piezoresonator 3 includes a front surface 17 and a back surface 18 substantially parallel to a plane defined by longitudinal axes 15 and 16 in the directions of length (L) and width (B), respectively, of the piezoresonator 3. The clip device 4 can be used to apply the contact pad 2a to the rotor 1a.

In contrast to conventional piezoresonators, no additional clip devices are needed along the length of the piezoresonator 3. The combination of the first order longitudinal vibrational mode and the third order bending vibrational mode results in generally symmetric deformation of the piezoresonator 3 as compared to the typically asymmetric deformation of piezoresonators in conventional piezoelectric motors. Accordingly, no additional means for securing the piezoresonator 3 and contact pad 2a against the rotor are generally needed in the various embodiments of the present invention.

To form the first order longitudinal vibrational mode and the third order bending vibrational mode in the piezoresonator 3, an alternating voltage needs to be applied to excitation electrodes 7, 8, 9, 10, 11, 12, 13 on a front surface 17 surface of the piezoresonator 3 and a common electrode 6 on a back surface 18 of the piezoresonator 3. In particular, to enable such excitation modes the motor 100, 6 electrodes are arranged symmetrically along the length of the piezoresonator in two parallel rows of 3 electrodes along the length L of the piezoresonator 3, as shown in FIGS. 1 and 2. As previously described, by selection of the width (B) and the length (L) of the piezoresonator 3, both excitation modes can be enabled by providing an alternating voltage having an operating frequency of approximately $v_1$ or $v_2$. Furthermore, this alternating voltage is applied to a diagonal group of the electrodes 7-12 and the common electrode 6. The term "diagonal group", as used herein with respect to electrodes 7-12, refers to a group of the electrodes 7-12 along the length L which are located diagonally from each other. For example, for the motor 100 in FIGS. 1 and 2, electrodes 7, 9, 11 would be in a first diagonal group and electrodes 8, 10, 12 would be in a second diagonal group. By applying the alternating voltage to a diagonal group, the excitation modes are enabled in the piezoresonator 3, resulting in the vibration of the contact pad 2a in a elliptical path 21a. The vibration of the contact pad 2a therefore results in the contact pad 2a applying a force to the rotor 1a, causing the rotor 1a to rotate.

Forward and reverse motion of the rotor 1a is provided by selection of the diagonal group. As described above, the arrangement of electrodes 7-12 provides a first and a second diagonal group. Therefore, to provide motion of the rotor 1 in a first direction, the alternating voltage is applied to the first diagonal group (electrodes 7, 9, 11). The resulting elliptical path 21a of the contact pad 2a (clockwise rotation path) due to the alternating voltage at these electrodes (7, 9, 11) provides vibration that causes the rotor 1 to rotate in a first direction. To provide motion of the rotor 1 in a second direction, the alternating voltage is applied to the second diagonal group (electrodes 8, 10, 12). The resulting elliptical path (not shown) of the contact pad 2a (opposite to path 21a) due to the alternating voltage at these electrodes (8, 10, 12) provides vibration that causes the rotor 1a to rotate in a second direction opposite to the first direction. Such a configuration provides a relatively high efficiency motor, since the motion of the contact pad 2 when in contact with the rotor 1a is substantially in the same direction as the desired direction of rotation for the rotor 1a.

Figure 3:
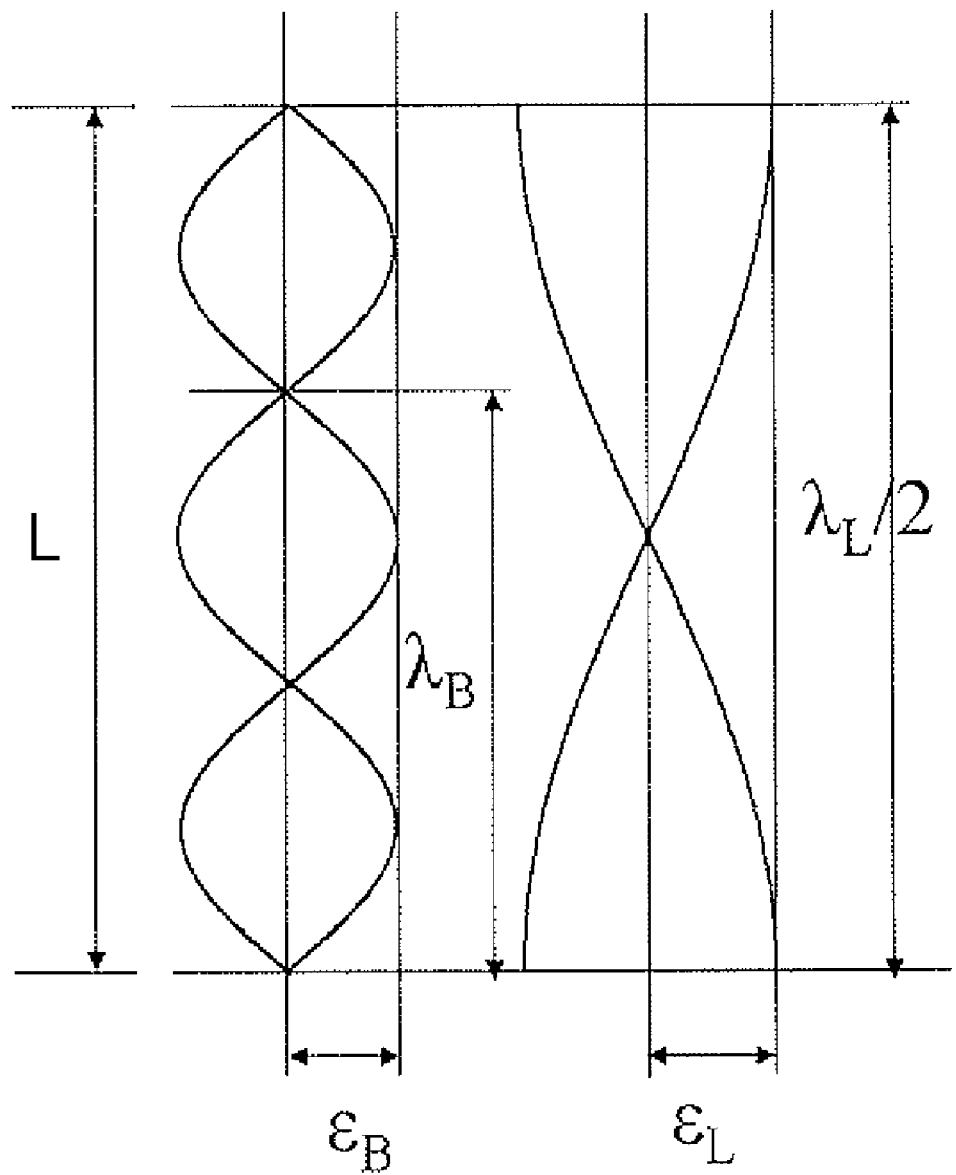
FIG. 3 is a plot of waveforms depicting the displacement of the piezoresonator in the first longitudinal vibrational mode and the third bending vibrational mode.

As previously described, the elliptical path 21a is provided by the combination of the displacement of piezoresonator 3 according to the first order longitudinal vibrational mode and the third order bending vibrational mode. A plot of each of these displacement types in shown in FIG. 3. FIG. 3 is a plot of waveforms depicting the displacement of the piezoresonator for the first order longitudinal vibrational mode and the third order bending vibrational mode along a first longitudinal axis. As shown in FIG. 3, along the L length of the piezoresonator 3 and along the first longitudinal axis, the amplitude of the dimensional changes along the length of the piezoresonator 3 due to the first order vibrational mode is $\epsilon_L$, where $\epsilon_L$ is the dimensional displacement in the direction of the length L. The amplitude of the dimensional changes along the length of the piezoresonator 3 due to the third order being mode is $\epsilon_B$, where $\epsilon_B$ is the dimensional displacement in a direction perpendicular to the length L, i.e. in the direction of the width B. $\lambda_B$ is the wavelength of the bending deformation and $\lambda_L$ is wavelength of the longitudinal deformation. As shown in FIG. 3, the third order bending vibration mode provides a symmetric deformation of the piezoresonator 3 along it length. Therefore, even though the piezoresonator 3 causes the contact pad 2 to vibrate in an elliptical path on the first end 20, no additional clips are necessary to support or secure the piezoresonator 3 along its length, due to the symmetrical vibrations induced.

Figure 4A:
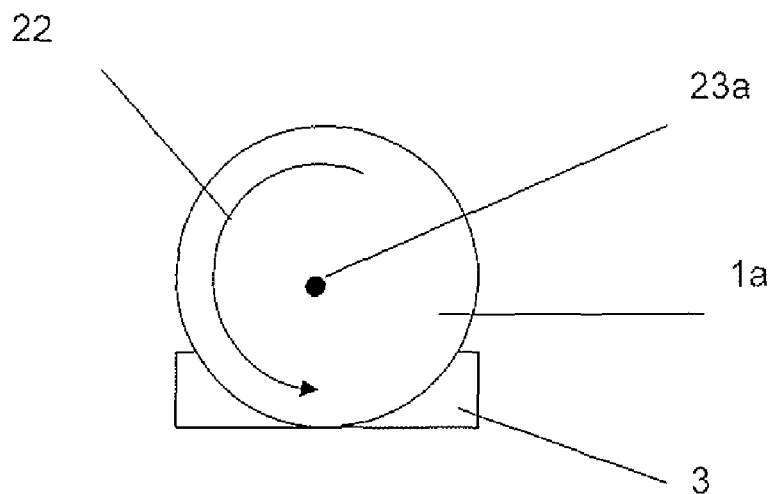
FIGS. 4A and 4B are top and side views of a first exemplary configuration of a piezoelectric motor and a rotor in accordance with an embodiment of the present invention.
Figure 4B:
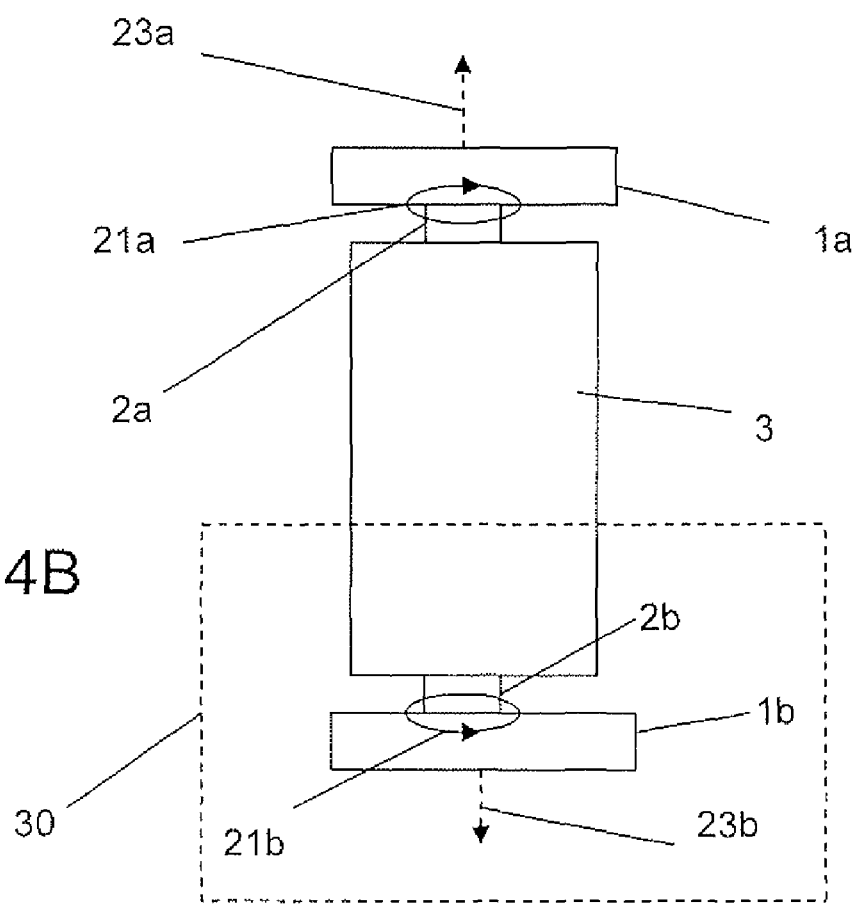

In general, the rotor 1a and the piezoresonator can be arranged in various configurations. For example, the elliptical path of a contact pad and the axis of rotation of a rotor can be parallel. FIGS. 4A and 4B are top and side views, respectively, of a first exemplary configuration of the piezoresonator 3, the contact pad 2a, and the rotor 1a in accordance with an embodiment of the present invention. As shown in FIGS. 4A and 4B, the piezoresonator 3, the contact pad 2a, and a cylindrical rotor 1a are arranged to provide an elliptical path 21a (or an opposite elliptical path) for the contact pad 2a that is parallel to a rotational axis 23a of the rotor 1a. That is the contact pad 2a is arranged to contact the flat ends of the cylindrical rotor 1a and cause rotation of the rotor 1a in direction 22a when the contact pad travels in elliptical path 21a due to an alternating voltage applied to a first diagonal group (not shown) of the piezoresonator 3. To cause rotation of the rotor 1a in a direction opposite to direction 22a (i.e., a reverse direction), the alternating voltage is applied to a second diagonal group (not shown) of the piezoresonator 3.

In some embodiments, a single rotor 1a can be used. However, in an alternative embodiment, additional structure 30 can be added to allow the piezoresonator 3 to rotate simultaneously two rotors 1a and 1b, where rotor 1b is opposed from rotor 1a such that the two rotors 1a, 1b are situated on the two opposite ends of the piezoresonator 3. The direction of rotation 21b of the rotor 1b is opposite to the direction of rotation 22 of the rotor 1a due to the fact that the contact pad 2b travels an elliptical path 21b in opposite direction in respect to the elliptical path 21a associated with contact pad 2a. In the various embodiments of the invention, the rotational axes 23a and 23b can be the same or different. Still, it should be understood that the invention is not limited in this regard.

Figure 5:
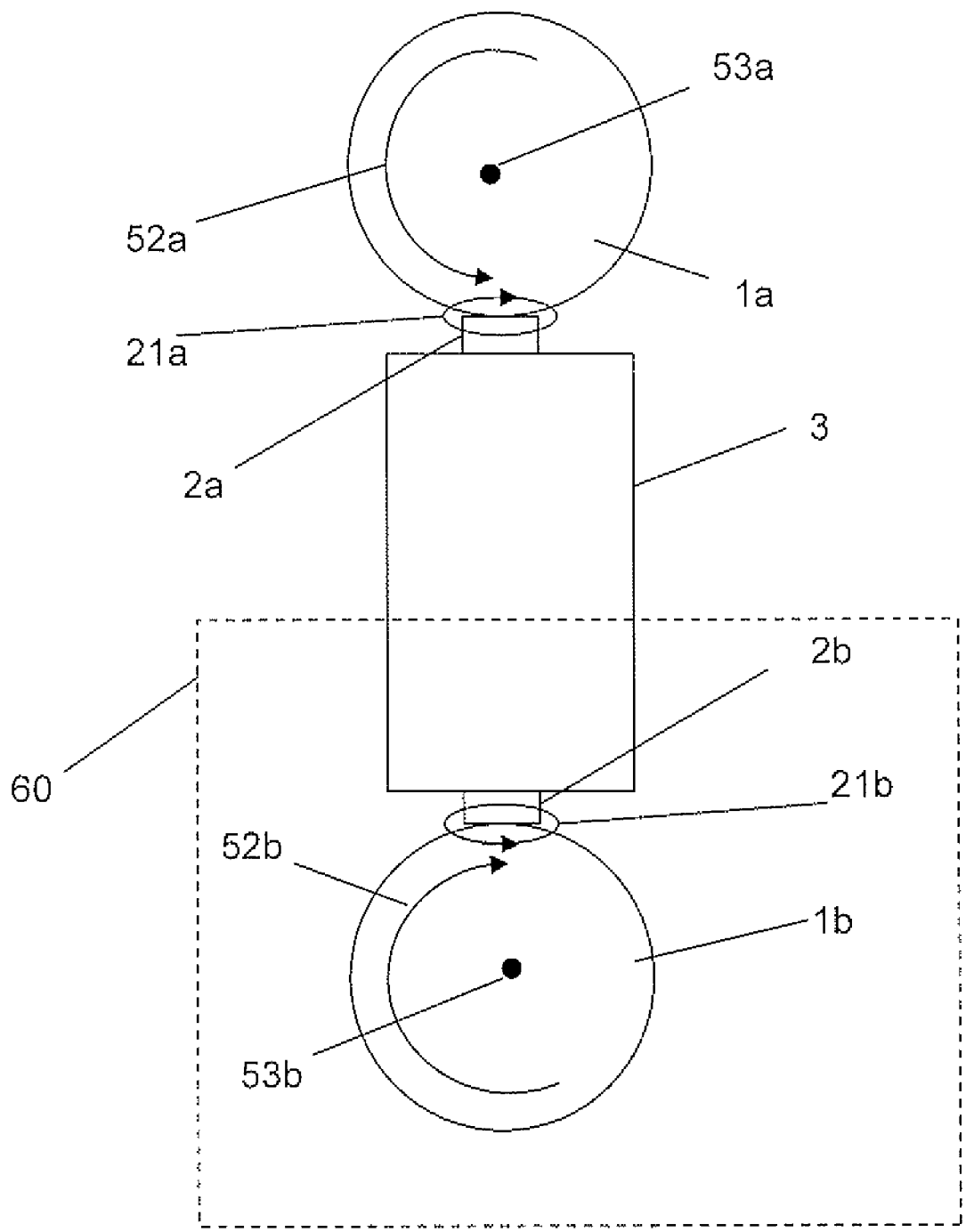
FIG. 5 is a side view of a second exemplary configuration of a piezoelectric motor and a rotor in accordance with an embodiment of the present invention.

In another example, the elliptical path of a contact pad and the axis of rotation of a rotor can be perpendicular. FIG. 5 is a side view of a second exemplary configuration of the piezoresonator 3, the contact pad 2a, and the rotor 1a in accordance with an embodiment of the present invention. As shown in FIG. 5, the piezoresonator 3, the contact pad 2a, and a cylindrical rotor 1a are arranged to provide an elliptical path 21a (or an opposite elliptical path) for the contact pad 2a that is perpendicular to a rotational axis 53a of the rotor 1a. That is the contact pad 2a is arranged to contact the circumference of the cylindrical rotor 1a and cause rotation of the rotor 1a in direction 52a when the contact pad travels in elliptical path 21a due to an alternating voltage applied to a first diagonal group (not shown) of the piezoresonator 3. To cause rotation of the rotor 1a in a direction opposite to direction 52a (i.e., a reverse direction), the alternating voltage is applied to a second diagonal group (not shown) of the piezoresonator 3.

In an alternative embodiment, the piezoresonator 3 can include additional structure 60 for rotating simultaneously two rotors 1a and 1b situated on two opposing ends of the piezoresonator 3. The direction of rotation 52b of the rotor 1b is opposite to the direction of rotation 52a of the rotor 1a due to the fact that the contact pad 2b travels an elliptical path 21b in opposite direction in respect to the elliptical path 21a associated with contact pad 2a. In the various embodiments of the invention, the rotational axes 53a and 53b can be oriented in the same or different direction.

Although the various embodiments of the present invention have been described with respect to an arrangement of 6 electrodes positioned symmetrically in two rows, the present invention is not limited in this regard. In other embodiments, a piezoelectric motor can be configured to have excitation in the piezoresonator of the $3n^{th}$ order bending mode and $n^{th}$ order longitudinal mode, where n is an integer $\geq 0$. To enable such excitation modes the motor must have 6n electrodes arranged symmetrically along the length of the piezoresonator in two parallel groups of 3n electrodes. For example, the motor 100 in FIGS. 1 and 2 uses the $3^{rd}$ order bending mode and the $1^{st}$ order longitudinal mode (n=1) and has therefore 6 electrodes situated in two groups of 3 along the length of the piezoresonator. The advantage of using higher order bending modes (n>1), is the increased ratio between the length and the width of the resonator (see equation (4)). This further facilitates an additional decrease in the width (outside diameter) of the motor for any given length of the piezoresonator. Regardless of the number of electrodes, the alternating voltage is still applied according to diagonal groups, as described above, to provide forward and reverse motion.

The locations or adjacent areas for the adjacent electrodes in the two rows in the piezoelectric motor can therefore be generalized for any selected n. In particular, a first portion of the adjacent electrode areas are located along L between $iL/n$ and $(3i+1)L/(3n)$, a second portion of the adjacent electrode areas are located along L between $(3i+1)L/(3n)$ and $(3i+2)L/(3n)$, and a third portion of the adjacent electrode areas are located along L between $(3i+2)L/(3n)$ and $(i+1)L/n$, where i is an integer and $n-1 \geq i \geq 0$.

Figure 6B:
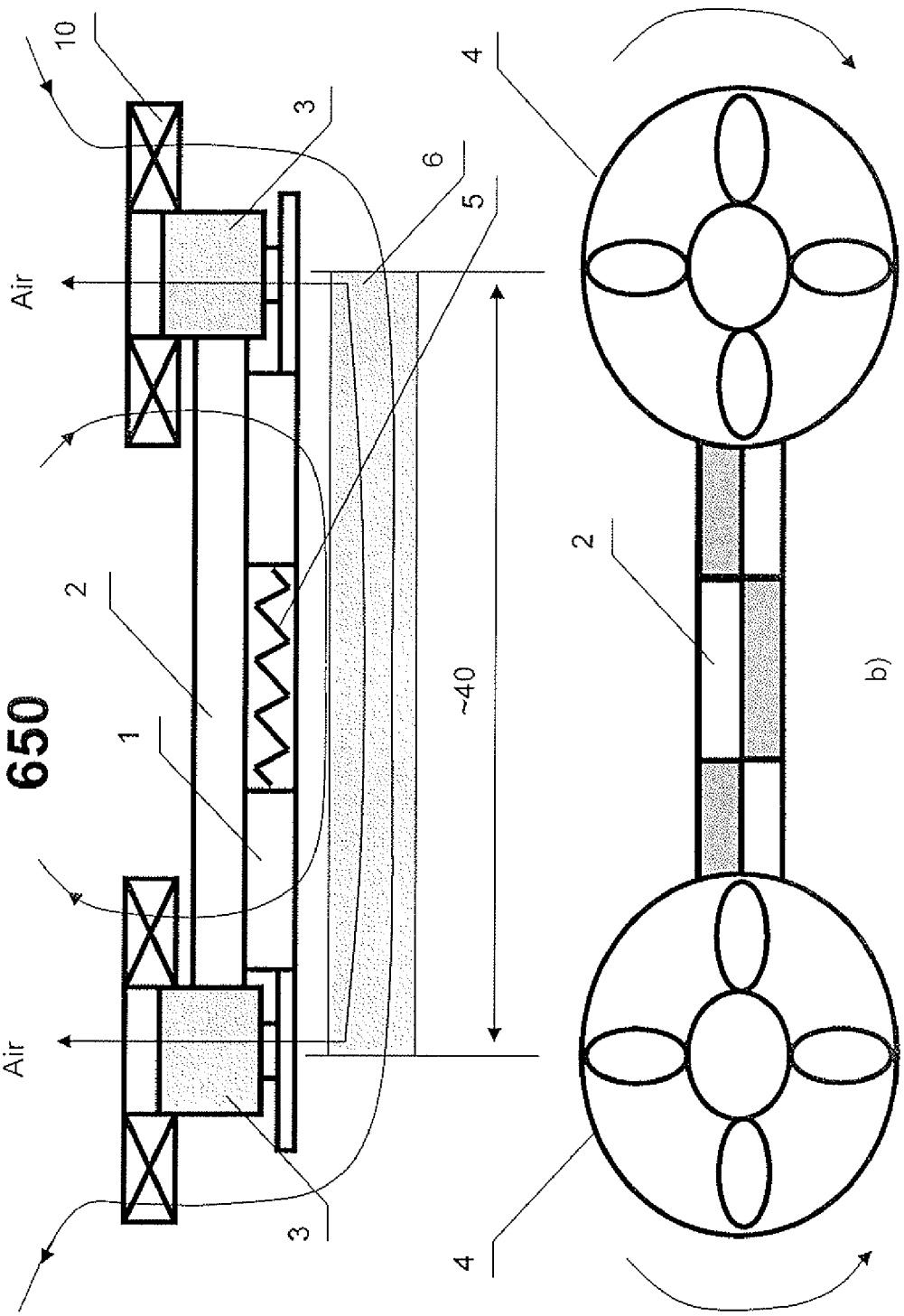
FIG. 6 is a drawing that is useful for understanding how the invention can be used as a motive force for a fluid pump in a micro-fuel cell.

An example of an application of the motor described herein would include its incorporation as the motor element part of a micro fuel cell pump. For example, a compact, economical and quiet airflow pump is needed as part of a new generation of efficient fuel cells. For example, a rotary impeller pump using a flat piezoelectric actuator that works on the principle of excitation of a longitudinal-bending vibrational mode to cause rotation of a rotor to which a fan is attached can be provided. Although a piezoresonator-based actuator is used, the rotary pumps described herein can be used with any type of actuator mechanism. FIG. 6A shows top and side views of rotary pump 600 using a single fan and a piezoresonator configured in accordance with an embodiment of the present invention. FIG. 6B shows top and side views of rotary pump 600 using two fans having opposite directions of rotation and a piezoresonator configured in accordance with an embodiment of the present invention. These designs includes a base 61, a piezoresonator 62; rotor(s) with bearing(s) 63, a fan 64, a spring 65, and a fuel cell element 66.

The rotary pump 600 in FIG. 6A works as follows. When the piezoelectric actuator 62 is electrically excited, its ends vibrate following an elliptical locus of movement, with the plane of this movement being parallel to the major plane of the piezoresonator 62. The elliptical path of the vibrations results from the combination of both bending and longitudinal deformations of the piezoresonator 62, stimulated by the electrical excitation of the piezoresonator 62. The end(s) of the piezoresonator 62 are held by pressure against the rotor(s) 63 provided by spring 65, so that the elliptical movement of the piezoresonator 62 ends transmits, via friction at the piezoresonator/rotor(s) contact area, rotation of the rotor(s) 63, which in turn causes the fan(s) 64 to rotate.

If the cross-sectional area of the rotating fan 64 is $S=1$ cm$^2$, and the coefficient for conversion of the linear movement at the end(s) of the piezoresonator 62 to rotary movement of the fan 64 is $K=0.4$ cm/rev, the required speed of rotation n of the fan 64 to ensure an airflow of $Q=200$ cm$^3$/min is:

$$n=Q/(K*S)=200/(0.4\times1)=500 \text{ rev/min} \qquad (6)$$

The advantages of such a design are numerous. The pump 600 can be configured in a very thin, flat and compact package that is amenable to assembly as an integral part of, or attachment to, the wall of the fuel cell enclosure. If the thickness of the piezoresonator 62 is less than 2 mm, the rotary pump would occupy a space in the order of 2-4 cm$^3$. The two-fan design for a rotary pump 650, as shown in FIG. 6b, increases the airflow capacity and facilitates greater efficiency in the supply of air to the fuel cell element 66. This design is intrinsically energy efficient and depending on the quality of the rotor bearing can be practically noiseless. In such embodiments, the minimum length of the rotary pump 650 is determined primarily by the length of the piezoresonator 62 and together with the rest of the associated hardware. If the thickness of the piezoresonator 62 is less than 2 mm, the rotary pump would occupy a space in the order of 3-4 cm$^3$.

Applicants present certain theoretical aspects above that are believed to be accurate that appear to explain observations made regarding embodiments of the invention based primarily on solid-state device theory. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:
1. A piezoelectric motor comprising:
   a piezoresonator body having a rectangular shape, opposing front and back surfaces and opposing first and second end surfaces, said front and said back surfaces being substantially parallel to first and second longitudinal axes of said piezoresonator body, and said first and said second end surfaces being substantially perpendicular to said first longitudinal axis and substantially parallel to said second longitudinal axis and separated by a length (L) of said piezoresonator body;
   at least one common electrode disposed on said back surface; and at least 6n excitation electrodes disposed across said front surface in two symmetric rows extending along L, where n is an integer $\geq 1$;

wherein a first diagonal group of at least 3n excitation electrodes are electrically coupled, and wherein a second diagonal group of at least 3n excitation electrodes are electrically coupled;

wherein said piezoelectric body has an $n^{th}$ order longitudinal vibration mode and a $3n^{th}$ order bending vibration mode collectively providing at least a symmetric bending deformation of said piezoelectric body along said length L during operation of said piezoelectric motor;

wherein said $n^{th}$ order longitudinal vibration mode has a frequency ($v_1$) along L, and said $3n^{th}$ order bending vibration mode has a frequency ($v_2$) along L; and wherein $v_1$ and $v_2$ are substantially equal.

2. The piezoelectric motor of claim 1, wherein a width of said front and said back surfaces along said second longitudinal axis defines a width (B) of said piezoresonator body, and wherein a ratio of L and B, when n=1, is defined by:

$$\frac{L}{B} = \frac{\pi(3.5)^2}{2} \cdot \frac{C_2}{C_1},$$

where $C_1$ is the velocity of propagation of longitudinal vibrations in the piezoresonator body, and where $C_2$ is the velocity of bending vibrations in the piezoresonator body.

3. The piezoelectric motor of claim 1, wherein said excitation electrodes are disposed in said symmetric rows in a plurality of adjacent electrode areas, and wherein a first portion of said plurality of adjacent electrode areas are located along L between $iL/n$ and $(3i+1)L/(3n)$, wherein a second portion of said plurality of adjacent electrode areas are located along L between $(3i+1)L/(3n)$ and $(3i+2)L/(3n)$, and wherein a third portion of said plurality of adjacent electrode areas are located along L between $(3i+2)L/(3n)$ and $(i+1)L/n$, where i is an integer and $n-1 \geq i \geq 0$.

4. The piezoelectric motor of claim 1, wherein n=1.

5. The piezoelectric motor of claim 1, further comprising:
at least one contact element disposed on said first end;
at least one spring-loaded support mechanically coupled to said second end; and
at least one alternating voltage source for applying an alternating voltage to said common electrode and said first or said second diagonal group to cause a nano-elliptical motion said contact element parallel to said first and said second longitudinal axes.

6. The piezoelectric motor of claim 5, wherein a frequency ($v_3$) of said alternating voltage source is approximately $v_1$ or $v_2$.

7. The piezoelectric motor of claim 5, further comprising at least one rotor having a rotational axis and disposed above said first end, when said rotor is positioned to physically contact said contact element during a portion of said nano-elliptical motion.

8. The piezoelectric motor of claim 7, wherein said rotor is positioned to provide a parallel arrangement of said rotational axis and said nano-elliptical motion.

9. The piezoelectric motor of claim 8, further comprising two opposing rotors, one disposed on each of two opposing ends of said piezoresonator body.

10. The piezoelectric motor of claim 7, wherein said rotor is positioned to provide a perpendicular arrangement of said rotational axis and said nano-elliptical motion.

11. The piezoelectric motor of claim 10, further comprising two rotors, one disposed on each of two opposing ends of said piezoresonator body.

12. The piezoelectric motor of claim 1, wherein said piezoresonator body is substantially cuboid.

13. The piezoelectric motor of claim 1, wherein said front and said back surfaces of said piezoresonator body are separated by a depth (D) of said cuboid, and wherein D<L and D<B.

14. The piezoelectric motor of claim 1, wherein said piezoresonator body is polarized in a direction substantially perpendicular to said first and said second longitudinal axes.

15. A piezoelectric motor comprising:
a piezoresonator body having opposing front and back surfaces and opposing first and second end surfaces, said front and said back surfaces being substantially parallel to first and second longitudinal axes of said piezoresonator body, and said first and said second end surfaces being substantially perpendicular to said first longitudinal axis and substantially parallel to said second longitudinal axis and separated by a length (L) of said piezoresonator body;
at least one common electrode disposed on said back surface; and
at least 6n excitation electrodes disposed across said front surface in two symmetric rows extending along L, where n is an integer $\geq 1$;
wherein said piezoelectric body has an $n^{th}$ order longitudinal vibration frequency ($v_1$) along L, wherein said piezoelectric body has a $3n^{th}$ order bending vibration frequency ($v_2$) along L, and wherein $v_1$ and $v_2$ are substantially equal;
wherein a width of said front and said back surfaces along said second longitudinal axis defines a width (B) of said piezoresonator body, and wherein a ratio of L and B, when n=1, is defined by:

$$\frac{L}{B} = \frac{\pi(3.5)^2}{2} \cdot \frac{C_2}{C_1},$$

where $C_1$ is the velocity of propagation of longitudinal vibrations in the piezoresonator body, and where $C_2$ is the velocity of bending vibrations in the piezoresonator body; and
wherein L/B is between 5 and 6.

16. A piezoelectric motor comprising:
a piezoresonator body having opposing front and back surfaces and opposing first and second end surfaces, said front and said back surfaces being substantially parallel to first and second longitudinal axes of said piezoresonator body, and said first and said second end surfaces being substantially perpendicular to said first longitudinal axis and substantially parallel to said second longitudinal axis and separated by a length (L) of said piezoresonator body;
at least one common electrode disposed on said back surface; and
at least 6n excitation electrodes disposed across said front surface in two symmetric rows extending along L, where n is an integer $\geq 1$;
wherein said piezoelectric body has an $n^{th}$ order longitudinal vibration frequency ($v_1$) along L, wherein said piezoelectric body has a $3n^{th}$ order bending vibration frequency ($v_2$) along L, and wherein $v_1$ and $v_2$ are substantially equal;

wherein a width of said front and said back surfaces along said second longitudinal axis defines a width (B) of said piezoresonator body, and wherein a ratio of L and B, when n=1, is defined by:

$$\frac{L}{B} = \frac{\pi(3.5)^2}{2} \cdot \frac{C_2}{C_1},$$

where $C_1$ is the velocity of propagation of longitudinal vibrations in the piezoresonator body, and where $C_2$ is the velocity of bending vibrations in the piezoresonator body; and wherein L/B is 5.5.

17. A piezoelectric motor comprising:
- a piezoresonator body having opposing front and back surfaces and opposing first and second end surfaces, said front and said back surfaces being substantially parallel to first and second longitudinal axes of said piezoresonator body, and said first and said second end surfaces being substantially perpendicular to said first longitudinal axis and substantially parallel to said second longitudinal axis and separated by a length (L) of said piezoresonator body;
- at least one common electrode disposed on said back surface; and
- at least 6n excitation electrodes disposed across said front surface in two symmetric rows extending along L, where n is an integer $\geq 1$;
- wherein said piezoelectric body has an $n^{th}$ order longitudinal vibration frequency ($v_1$) along L, wherein said piezoelectric body has a $3n^{th}$ order bending vibration frequency ($v_2$) along L, and wherein $v_1$ and $v_2$ are substantially equal; and
- wherein n=2.

18. A pump comprising a piezoelectric motor, said piezoelectric motor comprising:
- a piezoresonator body having a rectangular shape, opposing front and back surfaces and opposing first and second end surfaces, said front and said back surfaces being substantially parallel to first and second longitudinal axes of said piezoresonator body, and said first and said second end surfaces being substantially perpendicular to said first longitudinal axis and substantially parallel to said second longitudinal axis and separated by a length (L) of said piezoresonator body;
- at least one common electrode disposed on said back surface; and
- at least 6n excitation electrodes disposed across said front surface along L in two symmetric rows extending along L, where n is an integer $\geq 1$;
- wherein a first diagonal group of at least 3n excitation electrodes are electrically coupled, and wherein a second diagonal group of at least 3n excitation electrodes are electrically coupled;
- wherein said piezoelectric body has an $n^{th}$ order longitudinal vibration mode and a $3n^{th}$ order bending vibration mode collectively providing at least a symmetric bending deformation of said piezoelectric body along said length L during operation of said piezoelectric motor;
- wherein said $n^{th}$ order longitudinal vibration mode has a frequency ($v_1$) along L, and said $3n^{th}$ order bending vibration mode has a frequency ($v_2$) along L; and
- wherein $v_1$ and $v_2$ are substantially equal.

* * * * *